United States Patent [19]

Morrison

[11] Patent Number: 4,824,520

[45] Date of Patent: Apr. 25, 1989

[54] LIQUID ENCAPSULATED CRYSTAL GROWTH

[75] Inventor: Andrew D. Morrison, Altadena, Calif.

[73] Assignee: The United States of America as represented by the Administrator of the National Aeronautics and Space Administration, Washington, D.C.

[21] Appl. No.: 27,981

[22] Filed: Mar. 19, 1987

[51] Int. Cl.⁴ .............................................. C03B 15/02
[52] U.S. Cl. ................................ 156/620.1; 156/620.2; 156/DIG. 88; 156/DIG. 82; 156/DIG. 72; 156/DIG. 92
[58] Field of Search ............ 156/617 SP, 620.1, 620.2, 156/DIG. 88, DIG. 82, DIG. 72, DIG. 92

[56] References Cited

U.S. PATENT DOCUMENTS

| | | | |
|---|---|---|---|
| 3,370,927 | 2/1968 | Faust, Jr. | 23/301 |
| 3,401,023 | 9/1968 | Mullin | 23/301 |
| 3,463,680 | 8/1969 | Melngailis et al. | 148/172 |
| 3,472,615 | 10/1969 | Wang | 23/52 |
| 3,535,772 | 10/1970 | Knight et al. | 29/578 |
| 3,632,431 | 1/1972 | Andre et al. | 117/201 |
| 3,647,389 | 3/1972 | Weiner | 23/240 R |
| 3,741,817 | 6/1973 | Bienert et al. | 148/1.6 |
| 3,811,963 | 5/1974 | Hawrylo et al. | 148/172 |
| 4,303,464 | 12/1981 | Suzuki et al. | 156/605 |
| 4,431,476 | 2/1984 | Watanae et al. | 156/607 |
| 4,478,675 | 10/1984 | Akai | 156/605 |

FOREIGN PATENT DOCUMENTS 128538 12/1984 European Pat. Off. ...... 156/617 SP

*Primary Examiner*—William R. Dixon, Jr.
*Assistant Examiner*—Andrew Griffis
*Attorney, Agent, or Firm*—Thomas H. Jones; John R. Manning; Paul F. McCaul

[57] ABSTRACT

Low-defect crystals are grown in a closed ampoule under a layer of encapsulant. After crystal growth, the crystal is separated from the melt and moved into the layer of encapsulant and cooled to a first temperature at which crystal growth stops. The crystal is then moved into the inert gas ambient in the ampoule and further cooled. The crystal can be separated from the melt by decanting the melt into an adjacent reservoir or by rotating the ampoule to rotate the crystal into the encapsulant layer.

11 Claims, 2 Drawing Sheets

U.S. Patent Apr. 25, 1989 Sheet 2 of 2 4,824,520
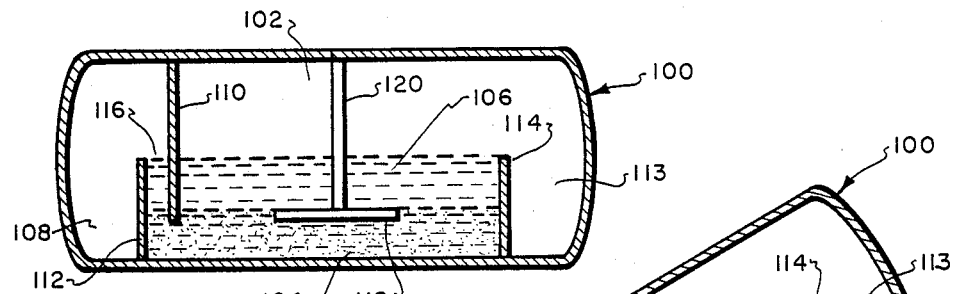
Fig. 4.
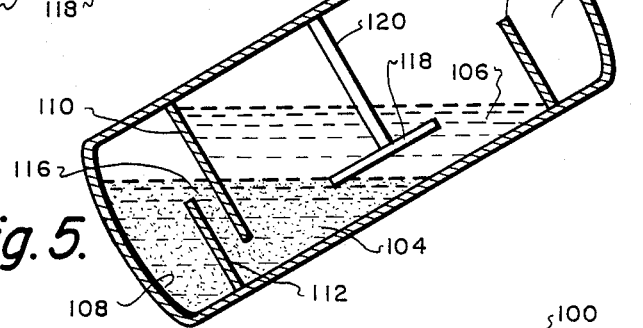
Fig. 5.
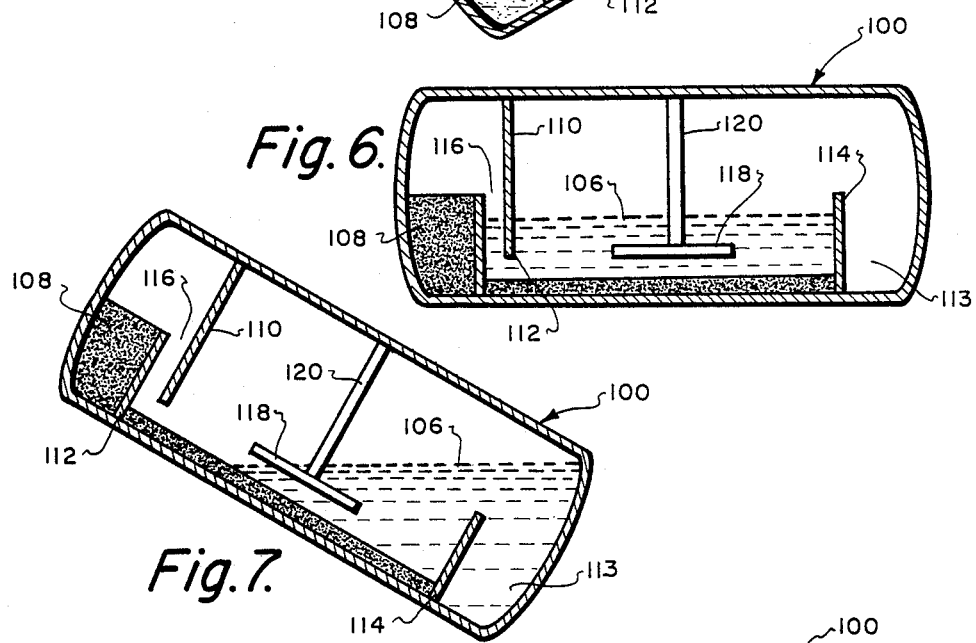
Fig. 6.
Fig. 7.
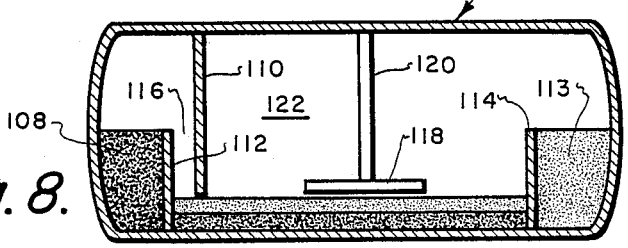
Fig. 8.

LIQUID ENCAPSULATED CRYSTAL GROWTH

ORIGIN OF INVENTION

The invention described herein was made in the performance of work under a NASA contract and is subject to the provisions of Public Law 96-517 (35 USC 202) in which the Contractor has elected not to retain title.

TECHNICAL FIELD

The present invention relates to growing of crystals and, more particularly, this invention relates to the growth of single III-B and II-VI crystals from a melt covered with an encapsulating fluid, followed by cooling the crystal in the encapsulant.

BACKGROUND ART

A wide variety of devices are currently under development utilizing the wider band gap materials such as gallium arsenide or gallium phosphide which provide high intrinsic electron mobility at low fields. Electron mobility of gallium arsenide is between five and six times that of silicon and offers the prospect of greatly increased performance in speed, power or both.

The low field electron mobility of GaAs is one of its greatest attributes and offers high frequency operation in devices such as the field effect transistor (FET). The technology of manufacturing high performance GaAs (FET's) is maturing at a rapid rate and the devices are experiencing a greatly expanding role in oscillator, mixer, logic element, power amplification and low noise/high gain applications especially in satellite communications, military weapon systems, IC test equipment and mainframe computers. However, the full potential has yet to be realized by substrate suppliers and device manufacturers. Present crystal preparation methods do not provide reliable and reproducible high performance devices.

The wider band gap materials, such as gallium arsenide, are all compounds which are subject to complex binary phase equilibria. In every case, one component of the compound, i.e., arsenic, is volatile. Escape of arsenic from the growing crystal causes crystal dislocation defects and vacancies which affect the parameters of the bulk crystal and also affect the structure and performance of epitaxial layers grown on the surface of the crystal.

Precise control of the As vapor pressure in the chosen growth system is required in order to maintain exact stoichiometry of the gallium arsenide compound during the growth process so as to achieve high mobility and crystal perfection.

One process utilized for commercial production of bulk gallium arsenide compound reduces arsenic related defects by providing a high arsenic vapor pressure. A source of arsenic is vaporized and reacts with gallium metal in a sealed quartz ampoule. This is followed by single crystal growth initiated and controlled by establishing thermal gradients for crystal growth across the ampoule (horizontal Bridgman). The resulting semi-circular wafers are small and are not compatible with wafer handling equipment developed for the silicon IC industry. Furthermore, the wafers are of poor quality and still exhibit high inherent defect densities.

The initial thrust of GaAs IC development activities required the growth of an epitaxial GaAs IC layer whose quality was directly dependent upon the quality of the substrate material. The large defect densities inherent in the Bridgman crystal material would directly propagate into the epitaxial layer during its growth phase. The unpredictable and generally poor quality of this material proved a major stumbling block in GaAs IC development.

Mengailis et al (U.S. Pat. No. 3,463,680), Knight et al (U.S. Pat. No. 3, 535,772), Andre (U.S. Pat. No. 3,632,431) and Haurylo et al (3,811,963) all disclose liquid phase epitaxial growth (LPEG) by rotation or tilting an ampoule to flow a melt onto a surface of a III-V substrate to grow an epitaxial layer on that surface. The ampoule is then rotated a second time to move the melt off of the newly formed epitaxial layer.

A much better method of growing crystals is to pull a crystal from a melt according to the Czochralski method which is the standard method for growing most of the device grade silicon. This method cannot be utilized to grow crystals from compounds having volatile components at the crystallization temperature such as gallium arsenide unless the melt is encapsulated with a thin layer of inert liquid such as boric oxide and pressurizing the chamber with an inert gas such as argon or nitrogen. This non-reactive high pressure atmosphere counterbalances the arsenic dissociation pressure. Typical gas pressures during operation can exceed 30 atmospheres and require adequate safety precautions during the use of the crystal pulling equipment. U.S. Patents disclosing liquid encapsulated Czochralski (LEC) growth of crystals are U.S. Pat. Nos. 3,370,927; 3,401,023; 3,472,615; 3,647,389; 3,741,817; 4,303,464; 4,431,476 and 4,478,675.

Larger crystals with lower levels of background impurities are produced than typical Bridgman crystal material. Yields are also significantly higher and this method has proved quite successful and has become commercially feasible.

The temperature gradient at the interface is important since the growing crystal leaves the molten encapsulant environment where radiation heat transfer controls and enters the ambient inert gas where convective heat transfer processes control. Russ in Solid State Technology, August 1972, 29, 31 also reports on the need for temperature control and on the rapid heat loss associated with pulling a crystal from the melt through the thin liquid encapsulant into the gas atmosphere. Russ also reports that the growth process is inhibited if the $B_2O_3$ layer is over 2 cm thick. Johnson produced a polycrystalline GaAs by liquid encapsulated floating zone (EFZ) by multiple pass melting of a GaAs rod in a floating zone of $B_2O_3$ (J. Crystal Growth 30 [1975] 249-256).

The product of liquid encapsulated growth (LEC) is a single crystal containing substantial stress and stress artifacts (such as dislocations) due to extreme thermal gradients experienced by the crystal during growth and subsequent cool down. The LEC produced crystals are also characterized by inclusions of gallium in the surface of the crystal due to evaporation of arsenic or phosphorous from the surface of the crystal while it is at elevated temperatures when it exits the boric oxide encapsulant.

Crystal defects were reduced by closely controlling the thermal gradients in the growing crystal to reduce the formation of stress-induced defects and also to prevent the loss of one of the constituents of the compound until the crystal has cooled to a point where it is stable.

High quality crystals of wide band gap III-VB materials were produced in Ser. No. 706,564 by pulling the crystal from the melt into a temperature controlled column of liquid encapsulant long enough to maintain the crystal submerged until the crystal is relatively cool. Heating and/or cooling elements can be submerged in the column of encapsulant to precisely control and controllably lower the temperature of the liquid in contact with the crystal.

This accomplishes a variety of tasks. One, the volatilization of one component of the crystal is inhibited by encapsulation until the crystal is relatively cool. Second, stresses caused by extreme thermal gradients along the length of the crystal can be reduced by making the environment around the crystal have the temperature gradient most optimum for defect-free growth.

The wide temperature range over which the boric oxide or other encapsulant remains molten makes possible the use of the encapsulant to provide active and passive control of the temperature. The higher heat capacity of a liquid as compared to a gas also provides more sensitive and efficient medium for transmitting or extracting heat from the growing crystal.

The apparatus for continuous production of rod or sheet is fairly large and expensive. It is difficult to maintain precise temperature control along the extended encapsulant path. Furthermore, only a small portion of the III-V and II-VI binary and ternary baths are useful to grow crystals since impurities build up in a binary melt while the composition changes continuously in ternary melts. Since the newly formed crystal is near its melting point, it is a soft material. The pulling forces subject the soft crystal to plastic deformation causing crystal defects.

STATEMENT OF THE INVENTION

The process of the invention produces maximum crystal from a minimum amount of melt. The process of the invention is much simpler since it is a batch process and does not require continuous pulling of sheet or rod from the melt.

In the batch process of the invention, a stationary crystal is grown at the interface of a melt and supernatant liquid encapsulant in a closed ampoule. When the melt has reached a high limit of impurities by concentration, crystal growth is terminated. The crystal is separated from the melt and moved completely into the liquid encapsulant during the first phase of cooling. This removes the crystal from melt which has preferentially accumulated impurities as the crystal forms. As the encapsulant cools, the melt solidifies. The crystal is next removed from the encapsulant into the overlying inert gas atmosphere for further cooling before removing the crystal from the ampoule. The encapsulant can be decanted from the solidified melt or the crystal further rotated into the inert gas ambient.

The crystal can optionally be attached to a seed holder-rod assembly. The movement of the crystal can be achieved by tilting or rotating the ampoule to decant the melt and/ or encapsulant or the seed holder can be used to raise or tilt the crystal into the encapsulant and ambient gas space.

The process of the invention is inexpensive and utilizes much simpler equipment. Rotating furnaces used for epitaxial growth are available and can be adapted for use with the present process. Stresses due to steep thermal gradients or differential thermal expansion of the crystals are avoided and a maximum amount of crystal is produced from each melt. Furthermore, the process of the invention utilizes buoyancy to support the crystal without any mechanical stress until the crystal is strong enough to be self-supporting. Less mechanical defects are formed to provide a very high quality crystal.

The process of this invention permits direct growth in sheet form of gallium arsenide or gallium phosphide or any other material in which a two immiscible liquid system can be identified. The process is simple. It includes encapsulating a melt of the desired material, gallium arsenide, or gallium phosphide in this case, under a liquid which is not only immiscible with the melt, but also which has a lower melting point than the melt. Controlled cooling of the encapsulating liquid will in turn cool the melt along the liquid/liquid interface. When the lower encapsulated melt liquid cools below its crystallization point, a crystalline film will solidify. Crystallization can be seeded by placing a seed at the interface of the encapsulating liquid and the melt to initiate single crystal growth. Highest quality product is produced by forming a sheet from a batch of melt and terminating crystal growth when only a minor amount of melt, usually 5 to 10 percent by weight, remains in the crucible. The encapsulant and remaining melt are discarded before recharging the crucible for the next run. The crystal product of this process can be tailored to be close to the final sheet form needed for device application. Cooling the crystal in the encapsulating fluid and ambient gas is believed capable of producing a crystal of higher crystalline perfection than the Czochralski crystals currently grown.

These and many other features and attendant advantages of the invention will become apparent as the invention becomes better understood by reference to the following detailed description when considered in conjunction with the accompanying drawings.

BRIEF DESCRIPTION OF THE DRAWINGS

FIG. 4 is a schematic view of a further embodiment of an ampoule for growing sheet crystal shown in a first position.

FIG. 5 is a further schematic view of the ampoule of FIG. 4 shown in a second downward position to flow the melt into it reservoir;

FIG. 6 is another view of the ampoule rotated back to longitudinal position;

FIG. 7 is a further schematic view of the ampoule of FIG. 4 rotated in the reverse direction to flow encapsulant into its reservoir; and FIG. 8 is a further schematic view of the ampoule of FIG. 4 rotated back to horizontal position.

DETAILED DESCRIPTION OF THE INVENTION

Figure 1:
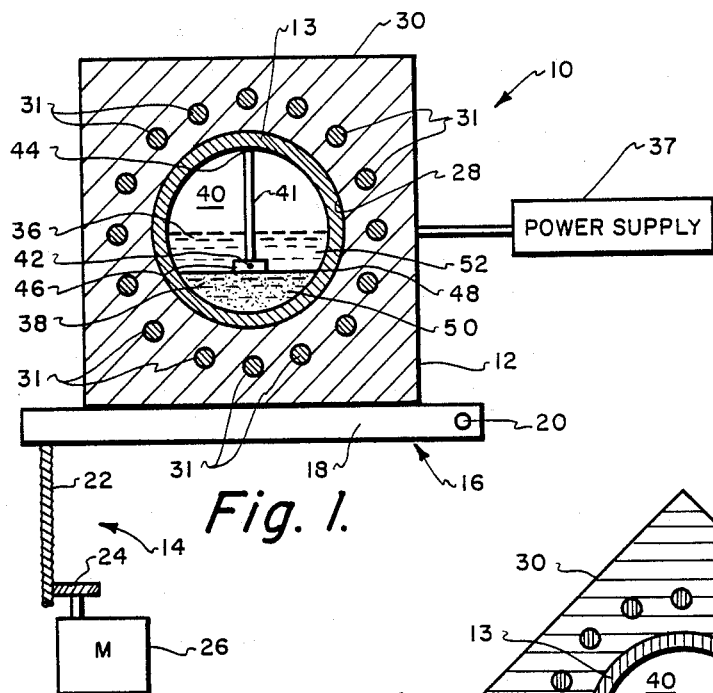
FIG. 1 is a schematic view of a first embodiment of an apparatus for forming sheets of crystal in accordance with the invention showing the ampoule in a first position.

The process of the invention is most useful for forming single crystals of wide band gap materials having band gaps exceeding 1.0 e.V. preferably from 1.5 e.V to 4.0 e.V. The invention is particularly directed to the III-V compounds having a volatile component such as gallium arsenide, indium arsenide, gallium phosphide, indium phosphide and various ternary and quaternary combinations such as gallium indium arsenide phosphide (GaInAsP) and various comparable II-VI systems such as cadmium telluride; mercury cadmium telluride, mercury zinc telluride or mercury zinc telluride. Gallium arsenide melts at about 1200° C. at atmospheric pressure and typical growth conditions will be at low pressure of about 5 psig to two atmospheres. Gallium phosphide melts at 1470° C. at about 32 atmospheres.

In order for an encapsulant to operate effectively, it must float on top of the melt and be inert to the melt and crucible. The ideal properties for an encapsulant are a lower density than the underlying melt and inertness and unreactivity with the melt and with the crucible. The encapsulant should be transparent so that the growth interface can be observed. Compounds should be low melting, have low vapor pressure, high purity and must wet both the melt and the crucible. Graphite has been found to be the most effective material for use as a susceptor cup and the crucible may be formed of pure fused quartz.

For the growth of gallium arsenide (Density=5.3 g/cc) or gallium phosphide (Density=4.1 g/cc) in a quartz crucible, boric oxide has been found to be the most effective encapsulant. Properties of boric oxide are provided in the following table:

TABLE I

| Property | Value |
| --- | --- |
| Density | 1.8 g/cc |
| Melting point | 450° C. |
| Vapor pressure | 1 mm at 1240° C. |
| Low reactivity with quartz, gallium arsenide, gallium phosphide | |
| Reacts with water | |

The layer of melt must have a minimum thickness of at least 2 cm to effectively encapsulate the melt. The layer of encapsulant should be at least the thickness of the final sheet so that the sheet can be completely separated from the melt and can be surrounded by encapsulant during the first cooling stage. Generally the encapsulant will be at least 2 cm thick up to about 20 cm in thickness, generally from 3 to 10 cm in thickness. In the case of the embodiment in which the sheet of crystal is rotated into the layer of encapsulant, the diagonal distance between opposite corners of the layer in the direction of rotation must exceed the width of the sheet in order for the sheet to be totally encapsulated.

In the process of the invention, the melt and the overlying layer of liquid encapsulant are disposed in a common ampoule. The ampoule is placed on a tilting table within a furnace or the furnace is placed on a tilting table. The furnace is operated at a first high temperature exceeding the melting point of the crystal by several hundred degrees. The furnace temperature is then decreased to a temperature near the crystallization temperature. This heating is suitably provided by external coils which heat a susceptor by inductance heating. Resistance heating may also be used. The temperature of the interface during crystallization is maintained at a temperature slightly below the crystallization point usually within 5° C. thereof. After the crystal is placed in the liquid encapsulant, the liquid encapsulant is slowly cooled to a temperature decreasing gradually from the melting temperature to a temperature at which the formation of crystal defects has terminated and the crystal can enter the inert gas headspace without inducing unacceptable stresses, suitably a temperature from 200° C. to 600° C. The crystal remains in the gas ambient until it has reached a temperature at which it can safely enter room temperature ambient without cracking, generally a temperature from 50° C. to 150° C.

Typical growth conditions are provided in the following table:

TABLE II

| Parameter | GaAs | GaP |
| --- | --- | --- |
| Temperature | 1238° C. | 1470° C. |
| Pressure | +1 Atm. | +50 Atm. |
| Ambient gas | N$_2$ | N$_2$, He |
| Preferred Seed Orientation | (111) | (111) |

The size of the first crystal depends on the geometry of the ampoule, temperature control and space between seeds. With multiple seeds, crystals can be grown up to at least 3 inches wide and up to at least 24 inches long. The thickness of the crystal to be self-supporting depends on the length and width of the crystal but is at least from 0.1 mm to 5 mm in thickness, usually from 1 to 2 mm in thickness. Growth is generally propagated at a rate of about 1 to 10 mm per hour. The ampoule can be charged with pre-formed compound or the semiconductor compound can be formed IN SITU in the ampoule from gallium reacting with arsenic vapor generated at extension to the ampoule containing arsenic heated to vaporization temperature. The preferred procedure is to load the ampoule with chunks of semiconductor compound and chunks of encapsulant.

Referring now to FIG. 1, the system 10 for forming a single crystal generally includes a growth ampoule 13, received within a furnace 12 and means 14 for rotating the ampoule which can be connected to the ampoule or to the furnace. As illustrated, the furnace 12 is placed on a rocker table 16. The platform 18 is pivoted at 20 and is rotated by a servo-mechanism such as a reversible screw-drive 22 connected to gear 24 driven by reversible motor 26.

The furnace 12 usually includes a susceptor cup 28 having a shaped cavity for receiving the ampoule 13. Heating elements 31 are mounted in the walls 30 of the furnace and are individually connected to and controlled by a controlled power supply 37.

The elements are preferably individually controlled to provide a controlled temperature profile within the ampoule so that an isothermal zone can be formed and direction of solidification can be controlled, especially in the case of long, cylindrical ampoules. Crystal furnaces are commercially available in which the temperature can be controlled both vertically and horizontally in both the length and width direction by means of computer control of a plurality of spaced heating elements. Resistive heating elements such as silicon carbide can be utilized. Graphite rods must be isolated from oxidizing agents such as oxygen. Initially the coldest point is at the seed. After nucleation begins in the uppermost layer of melt, the temperature adjacent to the seed is slowly cooled to form a solid sheet of crystal floating on the melt.

The ampoule 13 contains a liquid encapsulant zone 36 overlying the melt reservoir 38 and an upper head space 40 for receiving inert gas. A rod 41 carrying a seed holder 42 is attached to the upper wall 44 of the ampoule 13. A seed 46 is mounted in the seed holder 42 so that the seed 46 is positioned at the interface 48 of the melt 50 and the layer 52 of the encapsulant.

Figure 2:
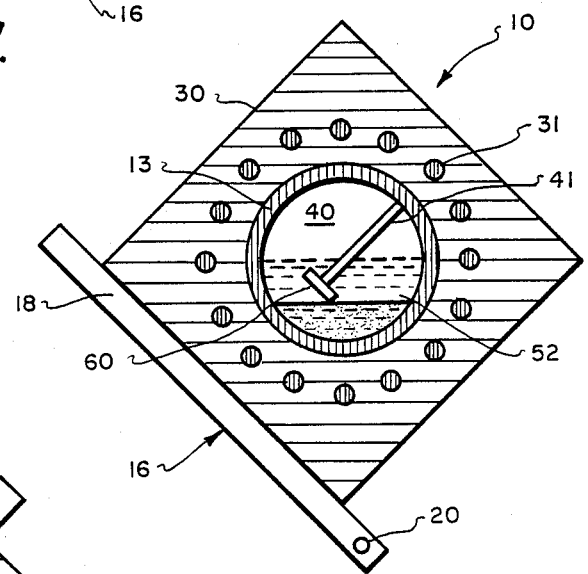
FIG. 2 is a schematic view of the ampoule rotated into a second position to separate the crystal from the melt and move it totally into the layer of liquid encapsulant.
Figure 3:
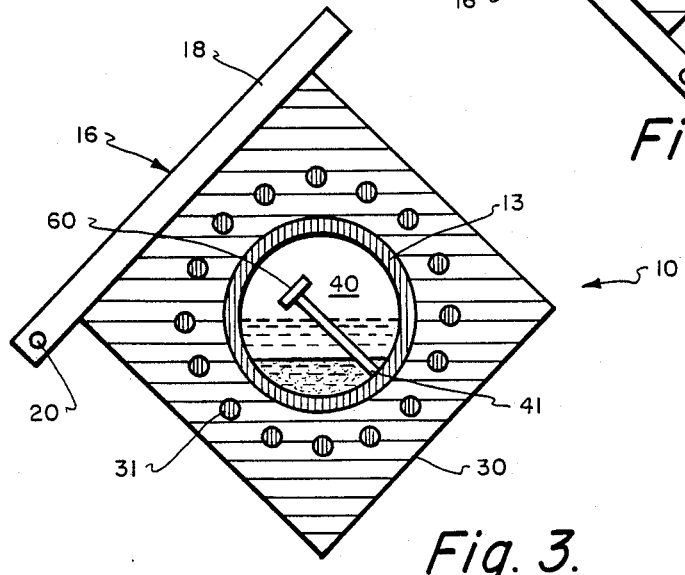
FIG. 3 is a schematic view of an ampoule rotated to a third position in which the sheet of crystal is rotated into the upper gas ambient of the ampoule.

Referring now to FIGS. 1-3, a sheet of crystal is grown in the ampoule by charging the ampoule with a preselected amount of compound to form the desired amount of sheet and a preselected amount of encapsulant to form a layer of minimum thickness. The controller is turned on to melt the contents of the ampoule and to form layer of encapsulant floating on an isothermal layer of melt. After nucleation and crystal growth, the crystal is separated from the remaining melt by rotating the platform to move the crystal 60 into the encapsulant layer 52 for the first stage of cooling. Cooling at a controlled isothermal rate in the encapsulant produces a crystal with less stress-induced defects. Since the encapsulant has a much lower solidification temperature than the melt, the crystal can be cooled in the encapsulant until the encapsulant is near its melting point. Final cooling is achieved as shown in FIG. 3 by further rotation of the ampoule 13 to position the crystal in the gas ambient 40. Further slow, isothermal cooling proceeds until the crystal is at a low temperature, generally near room temperature. The crystal never experiences steep thermal gradients or differential thermal expansion in the process of the invention.

In the embodiment of a crystal growth system illustrated in FIGS. 4-8, the ampoule need not be rotated past horizontal. Simple rocking of the ampoule serves to flow the melt or encapsulant from the crystal. In this embodiment, the ampoule 100 contains a first reservoir cavity 102 for forming a lower melt zone 104 and an upper encapsulant layer 106.

The melt zone 104 communicates with an adjacent melt reservoir 108 through a first series of baffle walls 110, 112. The encapsulant layer 106 communicates with an encapsulant reservoir 113 adjacent wall 114. Walls 112-114 are of the same height and extend from the bottom of the ampoule forming the cavity 102. Wall 110 extends from the top wall of the ampoule to the level of the encapsulant layer forming with wall 112 a gate 116 for selectively removing the melt 104.

As shown in FIG. 5, when the ampoule is first rotated downward toward the reservoir 108, the melt 104 flows out of the gate 116 into the reservoir 108. When the ampoule is rocked back to the original horizontal position, as shown in FIG. 6, the layer 106 of encapsulant falls down to surround the crystal 118 on the holder rod 120. As the temperature is lowered, the melt solidifies.

As shown in FIG. 7, as the ampoule 100 is now rocked in the reverse direction, the cooled liquid encapsulant flows over the wall 114 into the encapsulant reservoir 113. As the ampoule is rocked back to horizontal position, as shown in FIG. 8, the crystal sheet 118 will now be disposed in the inert gas ambient 122. Cooling proceeds until the crystal is at room temperature and the encapsulant material solidifies in the reservoir and in the area below the crystal.

A procedure for operating the system starts with cleaning the ampoule. Stoichiometric quantities of high purity gallium and arsenic are charged into the ampoule. Dehydrated, purified boric oxide pellets are then added in an amount sufficient to form a column of liquid about 2 cm in height. A seed crystal is inserted into the holder and is positioned at the interface. The controller-power supply is then activated and the ampoule is sealed. The ampoule is slowly heated to about 300° C. but below 325° C. to avoid loss of arsenic by volatilization. After the compound is formed after several hours, the temperature is raised to about 450° C. to melt the boric oxide.

The variable power supplies for the internal heating and cooling elements are then activated and the controllers for the inductance coils are positioned to provide the close control of the interface and to provide the desired temperature gradient. The seed crystal can be rotated by providing a sealed bushing in the ampoule for the seed holder rod. On observation of crystal nucleation and growth, the temperature gradient is controlled to grow a sheet extending from the seed holder.

The sheet growth process of the invention eliminates the substantial waste from slicing rod into wafers. Controlled thermal gradients in the liquid encapsulating environment and gas phase and absence of mechanical stresses should produce a sheet of higher crystalline perfection than those grown by other processes.

It is to be realized that only preferred embodiments of the invention have been described and that numerous substitutions, modifications and alterations are permissible without departing from the spirit and scope of the invention as defined in the following claims.

I claim:

1. A method of growing a sheet of single crystal of a material having a band gap exceeding 1.0 e.V. and which contains a volatile component from a molten pool of said material comprising the steps of:
    forming a pool consisting of molten precursor of said material;
    floating a layer of liquid encapsulant directly on top of the pool of molten precursor to form an interface between the top surface of the pool and the bottom surface of the layer, said encapsulant being inert to and having a lower density than the molten precursor and said layer having a thickness of at least 2 cm and a thickness exceeding that of the sheet of grown crystal;
    crystallizing the molten precursor at said interface to form a sheet of grown crystal having a thickness and a top surface and a bottom surface;
    moving the sheet of grown crystal completely into said layer of liquid encapsulant so that said top and bottom surface are in contact with said encapsulant and lowering the temperature of the sheet of grown crystal to a first temperature while the sheet is in the layer of encapsulant;
    moving the sheet of crystal out of the layer of liquid encapsulant into an inert gas phase; and
    lowering the temperature of the sheet of crystal while in said gas phase to a second temperature lower than the first temperature.

2. A method according to claim 1 in which the pool, layer and gas phase are enclosed in a common, closed ampoule.

3. A method according to claim 2 in which a seed crystal is disposed at the interface of the pool and the layer of liquid encapsulant.

4. A method according to claim 2 in which the ampoule is tilted to move the crystal.

5. A method according to claim 4 in which the pool of matter precursor and the layer of encapsulant are decanted during the tilting of the ampoule.

6. A method according to claim 1 in which the molten precursor is a Group IIIB-VB or IIB-VIB compound.

7. A method according to claim 5 in which the Group IIB-VIB compound is selected from CdTe, HgCdTe, HgZnTe or HgMgTe and the Group IIIB-VB compound is selected from gallium phosphide, gallium arsenide, indium arsenide or indium phosphide.

8. A method according to claim 6 in which the liquid layer comprises boric oxide.

9. A method according to claim 1 in which the thickness is from 2 cm to 20 cm.

10. A method according to claim 1 in which the temperature of the layer of encapsulant is cooled to a temperature from 200° C. to 600° C. during lowering of the temperature of the sheet of crystal to said first temperature.

11. A method according to claim 1 further including the step of cooling the crystal to a temperature of below 50° C. while it is in said gas phase.

* * * * *